United States Patent [19]

Zobel

[11] Patent Number: 4,780,625
[45] Date of Patent: Oct. 25, 1988

[54] INTEGRATED CIRCUIT SENSOR CIRCUIT

[75] Inventor: Don W. Zobel, Tempe, Ariz.

[73] Assignee: Motorola, Inc., Schaumburg, Ill.

[21] Appl. No.: 49,770

[22] Filed: May 12, 1987

[51] Int. Cl.$^4$ .................. H03K 5/153; H03K 5/24; H03F 3/45

[52] U.S. Cl. .................. 307/350; 307/530; 307/362; 307/491; 307/494; 307/303; 330/252; 330/257; 330/258

[58] Field of Search .............. 307/350, 530, 362, 491, 307/494, 303, 515; 330/257, 252, 258

[56] References Cited

U.S. PATENT DOCUMENTS

| | | | |
|---|---|---|---|
| 4,163,160 | 7/1979 | Frazee | 307/350 |
| 4,378,529 | 3/1983 | Dobkin | 330/258 |
| 4,574,221 | 3/1986 | Hess et al. | 315/209 T |

OTHER PUBLICATIONS

Data Sheets for Motorola Sense Amplifer MC1440.
Data Sheets for National Semiconductor Voltage Comparator IM111.
Pages 213 and 215 from the Transistor Circuit Analysis and Design Book by Fitchen.

Primary Examiner—John Zazworsky
Attorney, Agent, or Firm—Phillip H. Melamed

[57] ABSTRACT

An integrated circuit sensor circuit (10) is disclosed which is operable in differential or single-ended modes at DC input potentials which can be below the integrated circuit substrate bias potential (ground). Substrate injection is prevented and the circuit is operable for input signals which can vary relatively widely with respect to the substrate bias potential. This is accomplished even though only a single polarity power supply (+5 volts) with respect to substrate bias potential is used for the integrated circuit. An input stage of an integrated circuit (16) comprises a pair of identical polarity transistors (23, 24) operated in a differential common base mode with an opposite polarity transistor (25) used to supply appropriate bias potential to the common base connection. This prevents substrate injection while maintaining a wide operative range for the sensor circuit. Additional substrate injection preventing circuitry (31) is provided to maintain the collectors of the differential input transistors above the integrated circuit substrate base potential, and input protection circuitry (32-35) is used to limit the magnitude of applied input signals.

18 Claims, 1 Drawing Sheet

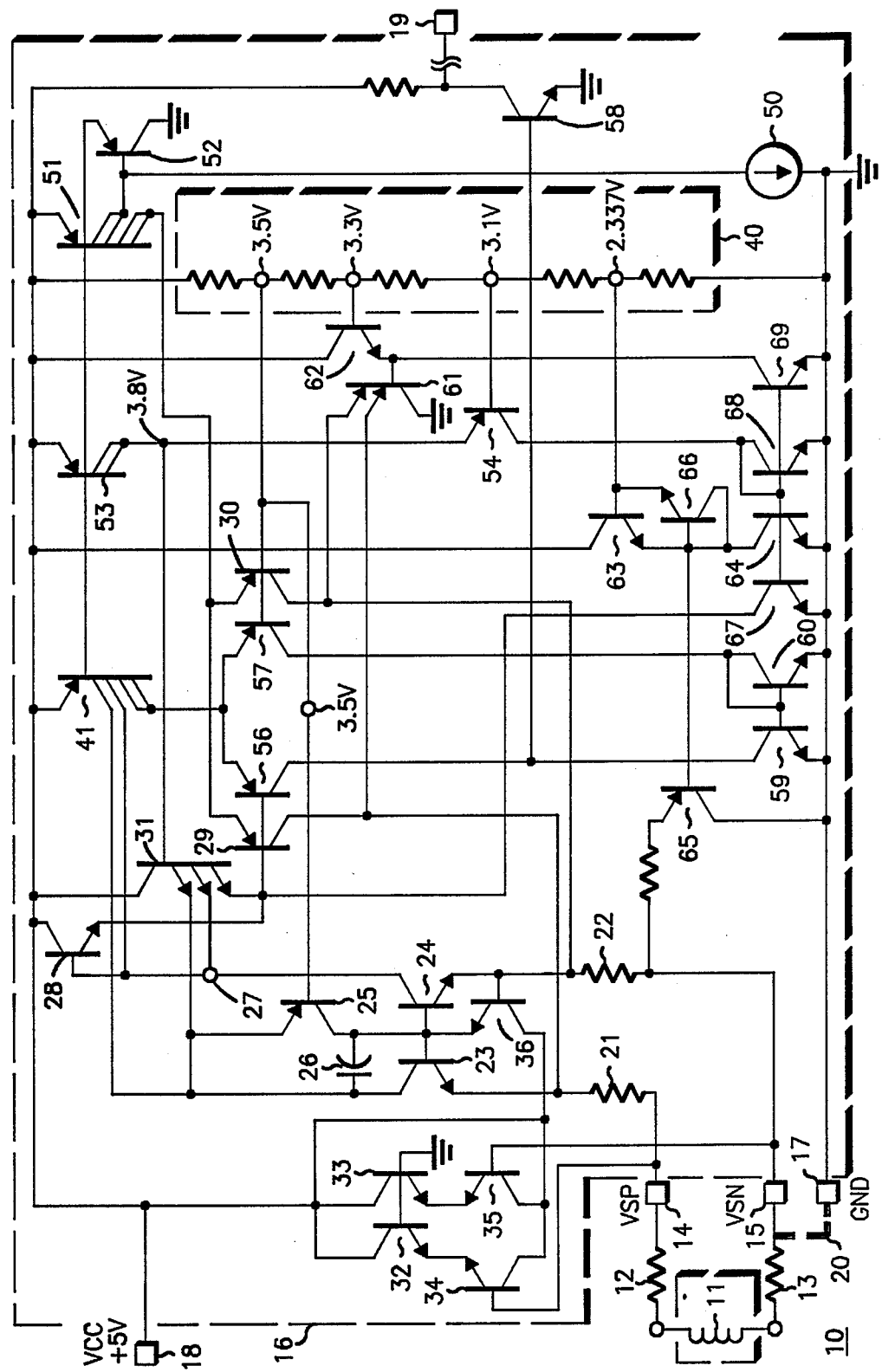

INTEGRATED CIRCUIT SENSOR CIRCUIT

BACKGROUND OF THE INVENTION

The present invention is related to the field of circuits utilized for monitoring the output of a sensor device. More specifically, the present invention is related to such sensor circuits which utilize an integrated circuit, and which preferably monitor the output of a sensor, such as a reluctance sensor, which senses engine crankshaft position of an internal combustion engine.

In prior internal combustion engine control systems, reluctance sensors are utilized to sense the passage of projections rotated synchronously with the engine crankshaft. Typically either reluctance or Hall effect sensors are utilized, and the output of these sensors must be suitably amplified to produce appropriate signals for further processing by an engine control module. Advantageously, the first circuit which receives the output of the sensor device is an integrated circuit (IC) such as Motorola, Inc. sense amplifier MC1440 or National Semiconductor voltage comparator/buffer LM111. The aforesaid integrated circuits essentially utilize a differential common emitter connected input stage to sense the output of a magnetic position sensor such as a reluctance sensor or a Hall effect device. However, these prior sense amplifiers typically cannot tolerate input DC levels which fall below the bias potential applied to the integrated circuit substrate base. This is because typically the integrated circuit substrate base must be maintained at the lowest possible voltage potential in order to prevent substrate injection which corresponds to forward biasing of the integrated circuit isolation junction between the IC substrate base and the epitaxial layer grown on top of the integrated circuit substrate base. The problem of substrate injection is discussed in U.S. Pat. No. 4,574,221 to Hess et al, assigned to the assignee of the present invention, in the context of preventing substrate injection due to transients caused by a large inductive or capacitive output loads. However, conventional integrated circuit sense amplifiers do not permit operation of either of their input terminals at potentials below the substrate bias potential since this would tend to produce substrate injection.

With prior integrated circuit sense amplifiers, in order to sense below ground input voltages, typically positive and negative power supplies must be utilized for supplying operative power to the sense amplifier. Then the IC substrate base is maintained at the lowest possible negative voltage potential. The requirement for both positive and negative power supplies adds to the expense of utilizing such sense amplifiers if it is necessary to operate at input signals which can vary both above and below ground potential.

SUMMARY OF THE PRESENT INVENTION

An object of the present invention is to provide an improved integrated circuit sensor circuit which overcomes the above-mentioned deficiencies of prior sensor circuits.

A more specific object of the present invention is to provide an improved integrated circuit sensor circuit which operates with input bias signals both above and below ground potential and utilizes just a single polarity power supply with respect to ground potential to supply operative power to the integrated circuit. This is to be achieved without the risk of substrate injection.

In one embodiment of the present invention a sensor circuit is provided. The sensor circuit comprses: an integrated circuit (IC) having a substrate base with a predetermined bias voltage applied thereto; said integrated circuit including first and second identical polarity transistors each having base, emitter and collector electrodes, said base electrodes being DC connected together and first and second input signal terminals of said integrated circuit coupled, respectively, to the emitter electrodes of said first and second transistors; said IC including an opposite polarity third transistor with base, emitter and collector electrodes and having its base and collector electrodes connected between an integrated circuit terminal having a reference voltage provided thereat and said commonly connected base electrodes of said first and second transistors, and an output terminal provided at the collector electrode of said second transistor, wherein said second transistor provides an output signal at said output terminal which is determined by at least the input signal provided at said first input terminal, whereby input bias voltages substantially below the predetermined bias voltage applied to said IC substrate base can be tolerated while said integrated circuit provides said output signal at said output terminal.

Essentially, the above-stated feature of the present invention relates to a configuration of three transistors forming the input stage of the integrated circuit. Preferably, a constant current source means supplies operative current to the collector electrode of the first transistor and the emitter electrode of the third transistor is DC connected to the collector electrode of the first transistor while the collector electrode of the third transistor is DC connected to the commonly connected bases of the first and second transistors. In this configuration the third transistor will essentially provide the proper bias at the bases of the first and second transistors to permit passage of substantially all of the current supplied by the constant current source means through the first transistor. This condition will be maintained despite the DC bias potential present at the first input terminal. Substrate injection will be inhibited by preventing the collector of the first transistor from falling below ground potential due to saturation of the first transistor. In other words, the biasing system of the present invention, for NPN first and second transistors, prevents saturation of the first transistor in response to negative applied voltages at the first input terminal and, therefore, maintains the collector of the first transistor above substrate bias potential (ground). This is implemented while maintaining essentially a common base differential input configuration between the first and second transistor emitters. The end result is an input stage for the integrated circuit which permits bias voltages below substrate base bias potential while preventing substrate injection but allowing operation of the input stage. In addition, the input stage will also function for DC bias potentials above the substrate bias potential.

In addition to the above discussed structure of the present invention, additional substrate injection prevention means is provided such that in response to transient voltages, the collectors of the first and second transistors are prevented from reaching potentials which would create substrate injection. In addition, the absolute magnitude of applied input signals to the input terminals is essentially clamped by an input signal protection circuit which prevents the occurrence of extremely large negative or positive voltages at the input terminals.

Preferably, the integrated circuit of the present invention is utilized in conjunction with a magnetic transducer such as a reluctance sensor connected across the input terminals. Typically one of the input terminals is connected to ground potential, which corresponds to the bias voltage applied to the integrated circuit substrate base. However, other configurations of the present invention are possible, such as applying an input signal to only one of the first and second input terminals and letting the other input terminal float to a potential determined by circuitry within the integrated circuit. The operation of the present invention, as well as additional advantages and features thereof, will now be further discussed.

BRIEF DESCRIPTION OF THE DRAWING

For a more complete understanding of the present invention, reference should be made to the drawing which comprises a schematic diagram of the sensor circuit of the present invention.

DESCRIPTION OF THE PREFERRED EMBODIMENTS OF THE INVENTION

Referring to the drawing, a sensor circuit 10 is illustrated which includes a magnetic reluctance sensor 11 having end terminals connected via resistors 12 and 13 (typically 10,000 ohms) to voltage sense positive (VSP) and voltage sense negative (VSN) input terminals 14 and 15 of an integrated circuit (IC) 16 shown dashed in the drawing. The terminals 14 and 15 correspond to external terminals of the integrated circuit 16 which also has a ground reference potential external terminal 17, a positive power supply external terminal 18 (VCC) at which a positive 5 volt potential is applied, and an output terminal 19. In addition, the FIGURE illustrates a ground path connection 20 being externally provided between the negative input terminal 15 and the ground terminal 17. The ground terminal 17 is connected to the substrate base of the integrated circuit 16 and ground potential corresponds to a predetermined bias potential applied to the IC substrate base.

Essentially, the reluctance sensor 11 is contemplated as sensing the passage of projections rotated synchronously in conjunction with the drive shaft (crankshaft) of a vehicle engine. The function of the sensor circuit 10 is to amplify the sensor pulses produced by sensor 11 which are representative of engine cycle position and provide an output at the terminal 19 that is used as an input to an engine control module which determines engine control parameters such as spark timing. In prior systems DC bias potentials at input terminals corresponding to the terminals 14 and 15 could not vary below the bias potential applied to the substrate base of the integrated circuit 16 because this would result in substrate injection. Substrate injection typically results in large integrated circuit currents which would vaporize wire bonds within the integrated circuit or create other permanent damage to the integrated circuit.

Generally a ground connection similar to the ground connection path 20 is present and will conduct current due to the operation of various circuit components external to the IC 16. This current can result in the positive and negative input terminals 14 and 15 having bias voltages below ground potential. Other sensor circuits solve this problem by requiring the use of both a positive and negative power supply so that the integrated circuit substrate bias can be maintained even lower than ground potential. However, the present invention enables operation of the integrated circuit 16 for bias potentials at the terminals 14 and 15 which can be either positive or negative with respect to substrate ground potential, and this is accomplished without the use of series capacitor coupling which would distort the signal produced by the reluctance sensor 11 and without the use of both a positive and negative power supply. All this is accomplished without risking substrate injection wherein isolation junctions in the integrated circuit would become forward biased and draw excessive integrated circuit current. The operation of the integrated circuit 16 will now be discussed in detail.

Essentially the terminals 14 and 15 correspond to input signal terminals of the integrated circuit 16, and these are coupled, respectively, through resistors 21 and 22, to the emitter electrodes of first and second NPN transistors 23 and 24 which have their bases DC connected together. The transistors 23 and 24 are identical polarity (NPN) transistors as contrasted with an opposite polarity (PNP) transistor 25 in the integrated circuit 16 which has its collector electrode connected to the bases of transistors 23 and 24 and its emitter electrode connected to the collector of transistor 23. The term "polarity" when used herein to refer to a transistor refers to the type of the transistor, such as NPN or PNP. In addition, a 3 picofarad compensating capacitor 26 is connected between the collector electrodes of the transistors 23 and 25. The base electrode of the transistor 25 is maintained at 3.5 volts wherein this bias voltage is obtained by virtue of a resistor divider 40 connected between the positive power supply terminal 18, at which 5 volts is applied, and the ground potential terminal 17 which corresponds to the substrate base bias potential which is ground.

Operative current for the collector of transistor 23 is provided by a constant current source which includes a collector electrode of a PNP transistor 41 connected to the collector electrode of transistor 23. A second collector electrode of the transistor 41 is also part of a constant current source connected to and providing operative current to the collector of the transistor 24.

Essentially, the transistors 23 through 25, along with the constant current sources which provide collector currents to transistors 23 and 24, comprise the input stage of the integrated circuit 16. The input stage monitors the difference between the voltages at the input eerminals 14 and 15 and provides a corresponding amplified difference output signal at a terminal 27 corresponding to the collector of the transistor 24. The terminal 27 is connected to the base of an NPN transistor 28 that provides a corresponding signal at its emitter electrode to the base of a transistor 29 which, together with a transistor 30, form a hysteresis feedback circuit which is coupled between the terminal 27 and the emitters of the input transistors 23 and 24.

A transistor 31 comprises an NPN multiple emitter transistor whose base is essentially maintained at a DC potential of approximately 3.8 volts by virtue of resistor divider 40 and the base emitter voltage of a transistor 54. The transistor 31 essentially comprises an additional collector voltage protection means so as to prevent the collectors of the transistors 23 and 24 from falling below 3.1 volts. Therefore, transistor 31 prevents the collectors of transistors 23 and 24, which are understood to be formed in and maintained at the same potential as separate portions of the epitaxial layer of the integrated circuit 16, from falling to a voltage below the integrated circuit substrate base bias potential (ground). This, therefore, prevents substrate injection from occurring due to transient signals which might occur so rapidly so as to prevent the transistor 25 from functioning rapid enough to also prevent substrate injection.

In addition to the aforementioned components, NPN transistors 32 through 35 are provided and function as an input signal protection circuit so as to prevent any externally applied voltage at the terminals 14 or 15 from ever being more positive than positive 5 volts (the voltage at terminal 18) plus one forward biased base emitter junction voltage drop of transistor 34 or 35 or from being more negative than −6.8 volts (corresponding to the breakdown voltage of the base emitter junction of one of the transistors 34 or 35) minus the forward bias voltage of the base emitter junction of one of the transistors 32 or 33, respectively. An NPN transistor 36 is also provided to protect the base emitter junction of the transistor 24 so that it is not subject to reverse bias breakdown in the event of a voltage being applied to the terminal 15 while a much less positive voltage is applied at the base of the transistor 24. The operation of the aforesaid components is as follows.

One of the collectors of a transistor 41 provides 2 microamps of constan current which is received by both the collector of the transistor 23 and the emitter of the transistor 25. Since the base of the transistor 25 is maintained at positive 3.5 volts, the transistor 25 will be biased on and the collector of the transistor 25 will provide a bias voltage at the base of the transistor 23 so as to maintain this transistor in an on condition such that substantially all of the the 2 microamps of constant current will be passed through the transistor 23. This is because the transistor 25 will not draw much current since its collector current corresponds to the base currents of the transistors 23 and 24. Thus the configuration in the drawing results in the transistor 23 being biased on by the opposite polarity PNP transistor 25 so as to maintain a constant current through transistor 23. The significance of this is that this operation will be maintained regardless of whether the voltage at the terminal 14 is positive or negative with respect to the integrated circuit substrate bias potential maintained at the terminal 17 (which corresponds to ground potential). In prior circuits a large negative voltage at the terminal 14 would saturate an input transistor like the transistor 23 and, therefore, pull down its collector voltage until it was below the substrate bias potential. That does not occur in the present situation because the voltage at the base of the transistor 23 will essentially be floating and determined by the transistor 25 such that a constant current will be provided through the transistor 23 thus preventing saturation of this transistor.

The presence of the transistor 24 enables the transistors 23 and 24 to operate in essentially a common base differential mode of operation so that the output signal provided at the terminal 27 corresponds to the amplified difference between the voltages at the input terminals 14 and 15. With the configuration of the present invention, bias voltages at the terminals 14 and 15 can vary between approximately positive 2.5 volts and minus 6 volts with the transistors 23 and 24 still acting to provide an amplified output signal at the terminal 27. Thus, for example, regardless of whether the common mode voltage at the terminals 14 and 15 is anywhere between positive 2.5 volts or minus 6 volts, if the voltage at terminal 14 is larger, by a predetermined threshold voltage, than the voltage at the terminal 15, this results in the transistor 24 being biased on and the voltage at the terminal 27 therefore falls to a relatively low level. If the voltage at the terminal 15, exceeds by a predetermined threshold, the voltage at the terminal 14, then the transistor 24 is biased off, and the voltage at the terminal 27 will rise due to the cutting off of the transistor 24. This predetermined threshold is determined not only by the biasing applied to the transistor 23 and 24, but also by the hysteresis feedback transistors 29 and 30. The operation of the hysteresis transistors 29 and 30 will now be discussed.

If it is assumed that the transistor 24 is on the verge of conducting or nonconducting, then a slight positive imbalance such that the voltage at the terminal 14 exceeds that at the terminal 15 will start the transistor 24 to conduct. This will result in lowering the voltage at the terminal 27 and therefore lowering the voltage at the emitter of the transistor 28. This condition results in having the transistor 29 conduct more heavily than the transistor 30 which, in turn, results in having the transistor 29 supply more current through the resistor 21 therefore increasing the potential at the emitter of the transistor 23. In this manner it can be seen that a slight imbalance between the emitter potentials at the transistors 23 and 24 will lead to a hysteresis effect essentially causing the snapping on of the transistor 24 due to transistor 29 increasing the voltage drop across the resistor 21 while there is a corresponding decrease in the voltage drop across the resistor 22 due to less conduction of the transistor 30 which supplies current though resistor 22. To obtain an opposite switching, now a threshold must be exceeded in the opposite sense in order for the hysteresis to take effect. The end result is that a plus and minus 240 millivolt hysteresis loop is implemented by the transistors 29 and 30 as will be understood by those of average skill in the art.

As was previously noted, the transistor 31 essentially acts to prevent substrate injection in case the transistor 25 fails to sufficiently protect against this occurrence. Normally, if the collector of the transistor 23 attempts to fall below 4.2 volts, this will turn off transistor 25 since the base of this transistor is maintained at plus 3.5 volts. When transistor 25 is turned off, this eliminates the base current to transistors 23 and 24 and, therefore, prevents these transistors from being turned on thus preventing saturation of these transistors which might result in their collector potentials being drawn below the substrate base potential of ground voltage. However, for transients, perhaps the transistor 25 may not turn off rapidly enough to guard against a transient voltage pulling down the collector voltages of the transistors 23 and 24. To protect against this occurrence, the transistor 31 is provided. This transistor prevents the collector voltages at the transistors 23 and 24 from ever falling below 3.1 volts due to the forward biasing of the base emitter junction of this transistor since its base is held at a positive 3.8 volts.

The transistors 32 through 35 comprise input protection circuit transistors to essentially prevent very large positive or negative voltages from existing at the input terminals 14 or 15 wherein these voltages might damage the operation of the integrated circuit 16. For a large positive voltage at the terminal 14, the collector base junction of transistor 34 will be forward biased and, therefore, the magnitude of the voltage at the terminal 14 will be clamped at a voltage equal to the 5 volts at the terminal 18 plus the forward bias of the base collector junction of the transistor 34. The maximum positive voltage at the terminal 15 is similarly clamped by the transistor 35. For a large negative voltage at the terminal 14, this will result in breaking down the base emitter junction voltage of the transistor 34 which now acts similar to a Zener diode having a breakdown voltage of −6.8 volts. Thus the maximum negative voltage possible at the terminal 14 is equal to the Zener voltage of −6.8 volts minus the forward bias voltage of the base emitter junction of the transistor 32. Thus a voltage of minus 7.5 volts is approximately the most negative voltage which can be possible at the terminal 14 The minimum negative voltage applied at the terminal 15 is also similarly limited by the transistors 35 and 33.

The function of the transistor 36 is to prevent breakdown of the base emitter junction of the transistor 24 in case a relative large positive voltage is applied at the terminal 15 with respect to the voltage being maintained at the base of the transistors 23 and 24. This condition is likely since the base of the transistors 23 and 24 can be maintained at below ground potential due to the operation of the transistor 25. The transistor 36 essentially functions by providing a forward biased base emitter junction across the base emitter junction of the transistor 24 in case the voltage at the emitter of transistor 24 is larger than the voltage at the base of this transistor. Thus transistor 36 makes sure that only 0.7 volts of reverse bias can be applied across the transist-or 24 base emitter junction. Similar protection is not needed for the transistor 23 since typically this transistor is biased on all the time by the transistor 25.

As discussed above, the operation of the input stage of the integrated circuit 16 results in the input stage being able to accommodate common mode bias voltages at the terminals 14 and 15 which are both above and below the substrate bias potential maintained at the terminal 17. This is accomplished while maintaining the operation of the input stage and occurs without the risk of substrate injection which would damage the integrated circuit 16. The remaining components illustrated in the drawing merely result in the suitable biasing of the aforesaid components, and their operation will now be very briefly described.

A 4 microamp constant current source 50 is provided and is connected to two collectors of a PNP transistor 51 which are tied together. A PNP transistor 52 is used to supply the appropriate base bias voltage for the transistor 51 such that each collector of the transistor 51 will draw a constant 2 microamps. Another two electrodes of the transistor 51 are tied together and, therefore, form a constant 4 microamp current source which supplies operating current to the emitters of the hysteresis transistors 29 and 30. A PNP transistor 53 also functions by current mirroring techniques to provide 4 microamps of current to a PNP transistor 54 which is used to provide the positive 3.8 volts at the base of the transistor 31 by virtue of a positive 3.1 volts being applied to the base of transistor 54 due to the resistor divider 40.

It should be noted that another function of the transistor 54 is to provide temperature compensation for the base emitter turn-on threshold of the transistor 31. This is provided by utilizing the temperature varying base emitter voltage of the transistor 54 to compensate for threshold variations of the temperature varying threshold of the base emitter turn-on voltage of the transistor 31.

The PNP transistor 41 is a multiple collector transistor and works off of the current mirror base emitter voltage provided by the transistor 51 to implement the two 2 microamp constant current sources utilized to supply current to the collectors of the transistors 23 and 24, respectively. Two additional collectors of the transistor 41 are tied together and form a 4 microamp constant current source which supplies emitter current to a pair of emitter-connected PNP transistors 56 and 57 which essentially implement an amplifying and isolation (buffer) common emitter differential amplifier stage that mirrors the operation of the hysteresis transistors 29 and 30 and provides an output signal at the collector of the transistor 56. This signal is coupled to the base of an NPN transistor 58 at whose collector the output terminal 19 of the integrated circuit is coupled thereto. Other amplifying circuitry (not shown) may be present between the collector of transistor 58 and the output terminal 19. Thus, in essence, the output of the integrated circuit 16 is derived from the output of the transistors 56 and 57 which, in turn, is determined by the conduction of the hysteresis transistors 29 and 30 that is, in turn, determined by the on/off switching of transistor 24.

NPN transistors 59 and 60 shown in the drawing are utilized to provide the appropriate loads to the collectors of the transistors 56 and 57 and implement equal switching thresholds for these transistors. Transistors 61 and 62 in the drawing are utilized to provide the appropriate bias voltages for the hysteresis transistors 29 and 30 and prevent saturation of those transistors by limiting the maximum collector voltage possible at the collectors of the transistors 29 and 30.

Transistor 63 and 64 provide the appropriate bias voltage for the transistor 65. Transistor 65 is utilized to provide bias to the terminal 15 if the circuit 10 is run as a single-ended input circuit with the terminal VSN not receiving any external input voltage. If an external connection is provided to the terminal 15, then transistor 65 is always off, but if no voltage is applied to the terminal 15, then transistor 65 can conduct and will provide a reference voltage at the emitter of the transistor 24 such that voltages at the emitter of the transistor 23 are now measured against this reference voltage. The transistor 65 is not needed if the reluctance sensor 11 is connected as shown in the drawing, but is merely an option in case a different external circuit configuration is utilized. A transistor 66 is provided to essentially protect the base emitter junction of the transistor 63 in case a high positive voltage at the terminal 15 exists which might break down the base emitter junction of the transistor 63 due to reverse biasing. The remaining transistors 67 through 69 are utilized to provide appropriate bias potentials for the previously recited transistors.

While specific embodiments of the present invention had been shown and described, further modifications and improvements will occur to those skilled in the art. For example, the present invention contemplates providing the 3 picofarad capacitor 26 between the collectors of the transistors 23 and 25. This capacitor is used to assure the stability of the input stage transistor configuration comprising transistors 23 through 25. However, other stability compensation techniques might be usable. In addition, as noted above, the present invention can be operated in either a differential mode with input signals being applied to both of the terminals 14 and 15, or in a single-ended mode with an external signal only being applied to the terminal 14. Also, while the present invention contemplates the use of a P-type substrate with an N-type epitaxial layer deposited thereon such that the key transistors such as transistors 23 and 24 are NPN transistors, obviously an opposite polarity-type situation could be utilized wherein an N-type substrate has a P-type epitaxial layer deposited thereon. All such modifications and improvements which retain the basic underlying principles disclosed and claimed herein are within the scope of this invention.

I claim:

1. A sensor circuit comprising:
    an integrated circuit (IC) having a substrate base with a predetermined bias voltage applied thereto;
    said integrated circuit including first and second identical polarity transistors each having base, emitter and collector electrodes, said base electrodes being DC connected together and first and second input signal terminals of said integrated circuit coupled, respectively, to the emitter electrodes of said first and second transistors;
    said IC including an opposite polarity third transistor with base, emitter and collector electrodes and having its base and collector electrodes connected between an integrated circuit terminal having a reference voltage provided thereat and said commonly connected base electrodes of said first and second transistors, and
    an output terminal provided at the collector electrode of said second transistor, wherein said second transistor provides an output signal at said output terminal which is determined by at least the input signal provided at said first input terminal, whereby input bias voltages substantially below the predetermined bias voltage applied to said IC substrate base can be tolerated while said integrated circuit provides said output signal at said output terminal;
    wherein said integrated circuit includes additional collector voltage protection circuitry means coupled to the collector electrodes of said first and second transistors for preventing the voltage at said collector electrodes from exceeding a predetermined voltage level with respect to said integrated circuit substrate bias potential despite the voltage applied to said input terminals, whereby forward biasing the integrated circuit substrate base isolation junction is prevented.

2. A sensor circuit according to claim 1 wherein said emitter electrode of said third transistor is DC connected to the collector electrode of said first transistor and wherein said collector electrode of said third transistor is DC connected to the bases of said first and second transistors.

3. A sensor circuit according to claim 2 wherein a constant current source means is connected to the collector electrode of said first transistor for supplying collector current thereto, the collector electrode of said third transistor providing suitable bias at the base of said first transistor to maintain said first transistor conductive to such an extent that substantially all of the current of said constant current source means is passed through said first transistor.

4. A sensor circuit according to claim 3 wherein said first and second transistors are NPN transistors and said third transistor is a PNP transistor.

5. A sensor circuit according to claim 4 wherein said PNP transistor is a lateral PNP transistor.

6. A sensor circuit according to claim 2 wherein said integrated circuit includes hysteresis feedback circuitry coupled between said output terminal and said emitter electrodes of said first and second transistors.

7. A sensor circuit according to claim 3 wherein said integrated circuit includes hysteresis feedback circuitry coupled between said output terminal and said emitter electrodes of said first and second transistors.

8. A sensor circuit according to claim 2 which includes a reluctance sensor, external to said integrated circuit, connected between said integrated circuit input terminals and providing a differential input signal therebetween.

9. A sensor circuit according to claim 8 wherein one of said input terminals is externally connected to an integrated circuit terminal corresponding to said integrated circuit substrate base at which said predetermined bias voltage is applied thereto.

10. A sensor circuit according to claim 1 wherein one of said input terminals is externally connected to an integrated circuit terminal corresponding to said integrated circuit substrate base at which said predetermined bias voltage is applied thereto.

11. A sensor circuit according to claim 1 wherein said integrated circuit includes input signal protection circuitry means connected to said integrated circuit input terminals for preventing voltage at said input terminals provided by circuitry external to said IC from exceeding maximum and minimum reference levels with respect to said integrated circuit predetermined substrate bias voltage.

12. A sensor circuit according to claim 11 wherein said integrated circuit substrate bias potential is ground voltage and wherein only single polarity power supply reference voltages with respect to said substrate bias potential are applied to said integrated circuit to supply operative power thereto.

13. A sensor circuit according to claim 1 wherein said additonal collector voltage protection means comprises a multiple emitter transistor having separate emitter electrodes connected to each of the collector electrodes of said first and second transistors, said multiple emitter transistor having a base electrode maintained at a reference potential.

14. A sensor circuit according to claim 3 wherein said IC includes a constant current source connected to the collector electrode of said second transistor for supplying collector current thereto.

15. A sensor circuit comprising:
    an integrated circuit (IC) having a substrate base with a predetermined bias voltage applied thereto;
    said integrated circuit including first and second identical polarity transistors each having base, emitter and collector electrodes, said base electrodes being DC connected together and first and second input signal terminals of said integrated circuit coupled, respectively, to the emitter electrodes of said first and second transistors;
    said IC including an opposite polarity third transistor with base, emitter and collector electrodes and having its base and collector electrodes connected between an integrated circuit terminal having a reference voltage provided thereat and said commonly connected base electrodes of said first and second transistors, and
    an output terminal provided at the collector electrode of said second transistor, wherein said second transistor provides an output signal at said output terminal which is determined by at least the input signal provided at said first input terminal, whereby input bias voltages substantially below the predetermined bias voltage applied to said IC substrate base can be tolerated while said integrated circuit provides said output signal at said output terminal;

wherein said integrated circuit includes hysteresis feedback circuitry means coupled between said output terminal and said emitter electrodes of said first and second transistors.

16. A sensor circuit comprising:

an integrated circuit (IC) having a substrate base with a predetermined bias voltage applied thereto;

said integrated circuit including first and second identical polarity transistors each having base, emitter and collector electrodes, said base electrodes being DC connected together and first and second input signal terminals of said integrated circuit coupled, respectively, to the emitter electrodes of said first and second transistors;

said IC including an opposite polarity third transistor with base, emitter and collector electrodes and having its base and collector electrodes connected between an integrated circuit terminal having a reference voltage provided thereat and said commonly connected base electrodes of said first and second transistors, and an output terminal provided at the collector electrode of said second transistor, wherein said second transistor provides an output signal at said output terminal which is determined by at least the input signal provided at said first input terminal, whereby input bias voltages substantially below the predetermined bias voltage applied to said IC substrate base can be tolerated while said integrated circuit provides said output signal at said output terminal;

wherein said integrated circuit includes input signal protection circuitry means connected to said integrated circuit input terminals for preventing voltage at said input terminals provided by circuitry external to said IC from exceeding maximum and minimum reference levels with respect to said integrated circuit predetermined substrate bias voltage.

17. A sensor circuit comprising:

an integrated circuit (IC) having a substrate base with a predetermined bias voltage applied thereto;

said integrated circuit including first and second identical polarity transistors each having base, emitter and collector electrodes, said base electrodes being DC connected together and first and second input signal terminals of said integrated circuit coupled, respectively, to the emitter electrodes of said first and second transistors;

said IC including an opposite polarity third transistor with base, emitter and collector electrodes and having its base and collector electrodes connected between an integrated circuit terminal having a reference voltage provided thereat and said commonly connected base electrodes of said first and second transistors, and an output terminal provided at the collector electrode of said second transistor, wherein an output signal is provided at said output terminal which is determined by at least the input signal provided at said first input terminal, wherein said emitter electrode of said third transistor is DC connected to the collector electrode of said first transistor and wherein said collector electrode of said third transistor is DC connected to the bases of said first and second transistors, wherein a constant current source means is connected to the collector electrode of said first transistor for supplying collector current thereto, the collector electrode of said third transistor providing suitable bias at the base of said first transistor to maintain said first transistor conductive to such an extent that substantially all of the current of said constant current source means is passed through said first transistor, wherein said integrated circuit includes additional collector voltage protection circuitry means coupled to the collector electrodes of said first and second transistors for preventing the voltage at said collector electrodes from exceeding a predetermined voltage level with respect to said integrated circuit substrate bias potential despite the voltage applied to said input terminals, and wherein said sensor circuit includes a reluctance sensor, external to said integrated circuit, connected between said integrated circuit input terminals and providing a differential input signal therebetween.

18. A sensor circuit according to claim 17 wherein said integrated circuit includes input signal protection circuitry means connected to said integrated circuit input terminals for preventing voltage at said input terminals provided by circuitry external to said IC from exceeding maximum and minimum reference levels with respect to said integrated circuit predetermined substrate bias voltage, and wherein said IC includes a constant current source connected to the collector electrode of said second transistor for supplying collector current thereto.

* * * * *